United States Patent
Blonigan et al.

(10) Patent No.: US 6,206,176 B1
(45) Date of Patent: Mar. 27, 2001

(54) SUBSTRATE TRANSFER SHUTTLE HAVING A MAGNETIC DRIVE

(75) Inventors: Wendell T. Blonigan, Union City; John M. White, Hayward, both of CA (US)

(73) Assignee: Applied Komatsu Technology, Inc., Tokyo (JP)

(*) Notice: Subject to any disclaimer, the term of this patent is extended or adjusted under 35 U.S.C. 154(b) by 0 days.

(21) Appl. No.: 09/082,605

(22) Filed: May 20, 1998

(51) Int. Cl.[7] ................................................ B65G 35/00

(52) U.S. Cl. ............................................ 198/619; 414/217
(58) Field of Search ........................ 198/619, 690.1, 198/805; 414/217

(56) References Cited

U.S. PATENT DOCUMENTS

| | | | |
|---|---|---|---|
| 3,850,105 | 11/1974 | Aronstein et al. | 104/1 R |
| 3,973,665 | 8/1976 | Giammanco | 198/19 |
| 3,976,330 | 8/1976 | Babinski et al. | 302/2 R |
| 4,047,624 | 9/1977 | Dorenbos . | |
| 4,166,563 * | 9/1979 | Peyraud et al. | 198/619 |
| 4,649,830 | 3/1987 | Tanaka | 104/138.1 |
| 4,682,927 | 7/1987 | Southworth et al. | 414/217 |
| 4,749,465 | 6/1988 | Flint et al. | 204/298 |
| 4,775,281 | 10/1988 | Prentakis | 414/416 |
| 4,829,445 | 5/1989 | Burney | 364/478 |
| 4,846,102 | 7/1989 | Ozias | 118/730 |
| 4,857,689 | 8/1989 | Lee | 219/10.71 |
| 4,870,923 | 10/1989 | Sugimoto | 118/715 |
| 4,913,929 | 4/1990 | Moslehi et al. | 427/39 |
| 4,951,601 | 8/1990 | Maydan et al. | 118/719 |
| 4,985,722 | 1/1991 | Ushijima et al. | 354/319 |
| 4,989,543 | 2/1991 | Schmitt | 118/723 |
| 5,001,327 | 3/1991 | Hirasawa et al. | 219/390 |

(List continued on next page.)

FOREIGN PATENT DOCUMENTS

| | | |
|---|---|---|
| 2114470 | 9/1972 | (DE) . |
| 3941110A1 | 6/1990 | (DE) . |
| 0 359 525 A2 | 3/1990 | (EP) . |
| WO94/00868 | 1/1994 | (EP) . |
| 0 608 633 A2 | 8/1994 | (EP) . |
| 0 684 630 A2 | 11/1994 | (EP) . |
| 0 756 316 A1 | 1/1997 | (EP) . |
| WO98/02911 | 1/1998 | (EP) . |
| 2171 119A | 8/1986 | (GB) . |
| 2 284 105 | 5/1995 | (GB) . |
| 59-53320 | 3/1984 | (JP) . |
| 61-117278 | 6/1986 | (JP) . |
| 63-141342 | 6/1988 | (JP) . |
| 3-136345 | 6/1991 | (JP) . |
| 404164718 * | 6/1992 | (JP) .................................. 198/619 |
| 08274142 | 10/1996 | (JP) . |
| 8-274142 | 10/1996 | (JP) . |

OTHER PUBLICATIONS

IBM Technical Disclosure Bulletin, vol. 17, No. 8, p. 2268–9, Jan. 1975, Y. Budo, R.D. Dreyer, A.C. Key, J.E. Kulak, B.E. MacKennie.

*Primary Examiner*—Jospeh E. Valenza
(74) *Attorney, Agent, or Firm*—Thomason, Moser & Patterson

(57) ABSTRACT

A magnetic drive system for moving a substrate transfer shuttle along a linear path between chambers in a semiconductor fabrication apparatus. A rack with rack magnets is secured to the shuttle, and a rotatable pinion with pinion magnets is positioned adjacent the rack so that the pinion magnets can magnetically engage the rack magnets. Thus, rotation of the pinion will cause the shuttle to move along the linear path. The magnets may be oriented with a helix angle between their primary axis and the axis of rotation of the pinion. One rack and one pinion are located on each side of the shuttle. A set of lower guide rollers supports the shuttle, and a set of upper guide rollers prevents the shuttle from lifting off the lower guide rollers.

13 Claims, 12 Drawing Sheets

U.S. PATENT DOCUMENTS

| | | | |
|---|---|---|---|
| 5,060,354 | 10/1991 | Chizinsky | 29/25.02 |
| 5,086,729 | 2/1992 | Katagiri | 118/729 |
| 5,110,249 | 5/1992 | Norman | 414/217 |
| 5,178,638 | 1/1993 | Kaneko et al. | 29/25.01 |
| 5,187,115 | 2/1993 | Coleman . | |
| 5,203,443 | 4/1993 | Toriumi et al. | 198/341 |
| 5,227,708 | 7/1993 | Lowrance | 318/640 |
| 5,252,807 | 10/1993 | Chizinsky | 219/390 |
| 5,259,883 | 11/1993 | Yamabe et al. | 118/725 |
| 5,275,709 | 1/1994 | Anderle et al. | 204/298.25 |
| 5,288,379 | 2/1994 | Namiki et al. | 204/192 |
| 5,292,393 | 3/1994 | Maydan et al. | 156/345 |
| 5,352,294 | 10/1994 | White et al. | 118/725 |
| 5,355,066 | 10/1994 | Lowrance | 318/640 |
| 5,377,816 | 1/1995 | Deligi et al. | 198/619 |
| 5,382,126 | 1/1995 | Hartig et al. | 414/217 |
| 5,425,611 | 6/1995 | Hughes et al. | 414/217 |
| 5,447,409 | 9/1995 | Grunes et al. | 414/744.6 |
| 5,469,035 | 11/1995 | Lowrance | 318/568.22 |
| 5,470,784 | 11/1995 | Coleman . | |
| 5,512,320 | 4/1996 | Turner et al. | 427/255 |
| 5,535,306 | 7/1996 | Stevens | 395/89 |
| 5,536,128 | 7/1996 | Shimoyashiro et al. | 414/273 |
| 5,537,311 | 7/1996 | Stevens | 364/167.01 |
| 5,607,009 | 3/1997 | Turner et al. . | |
| 5,611,865 | 3/1997 | White et al. | 118/725 |
| 5,674,786 | 10/1997 | Turner et al. . | |
| 5,701,627 | 12/1997 | Matsumura et al. | 15/88.2 |
| 5,846,328 | 12/1998 | Aruga et al. | 118/718 |
| 5,881,649 | * 8/1999 | Hasegawa et al. | 198/619 |
| 5,976,199 | 11/1999 | Wu et al. | 29/25.01 |

* cited by examiner

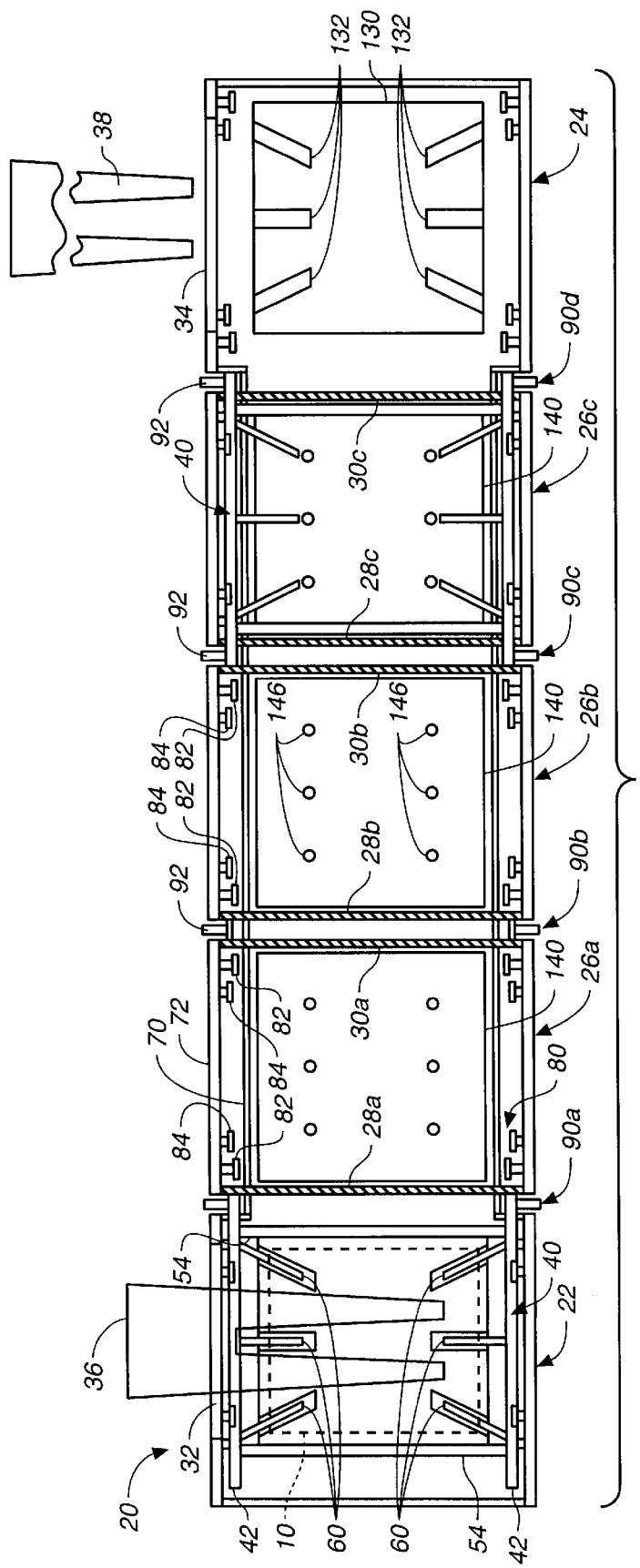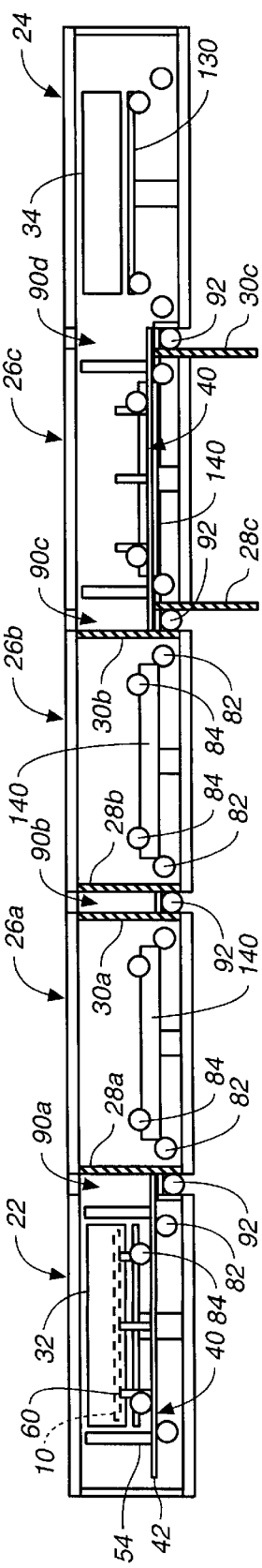

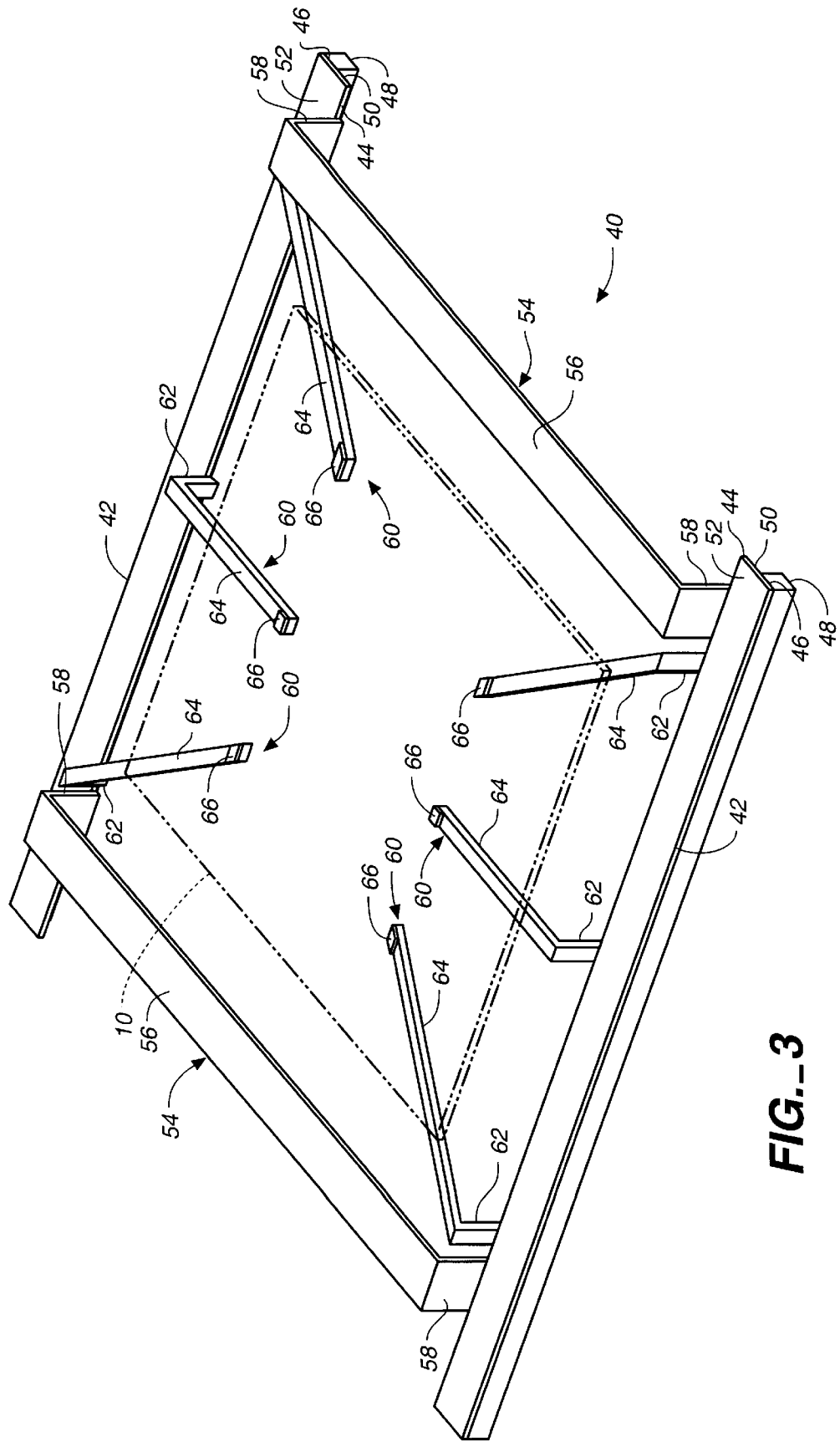
FIG._3

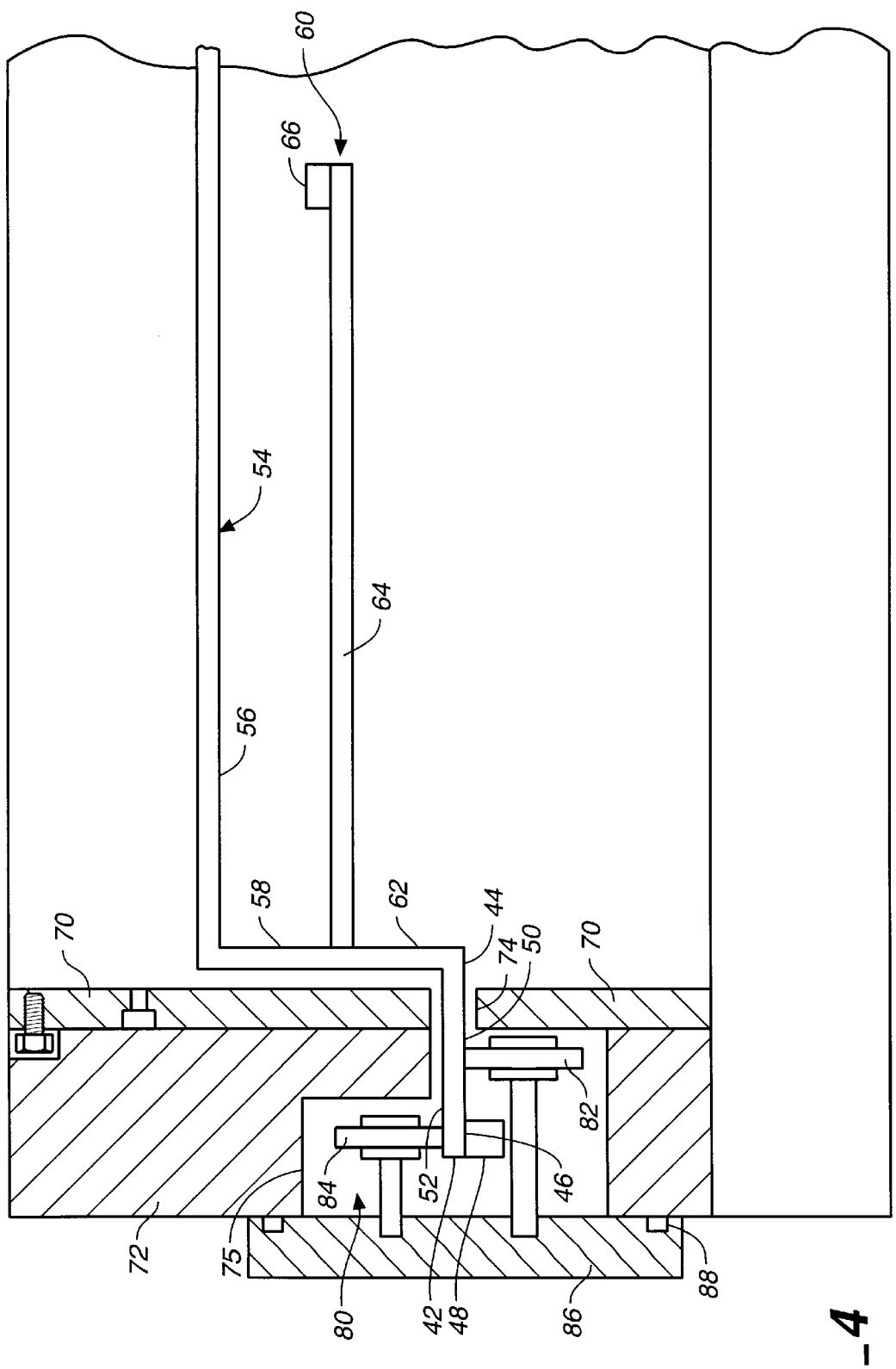
FIG._4

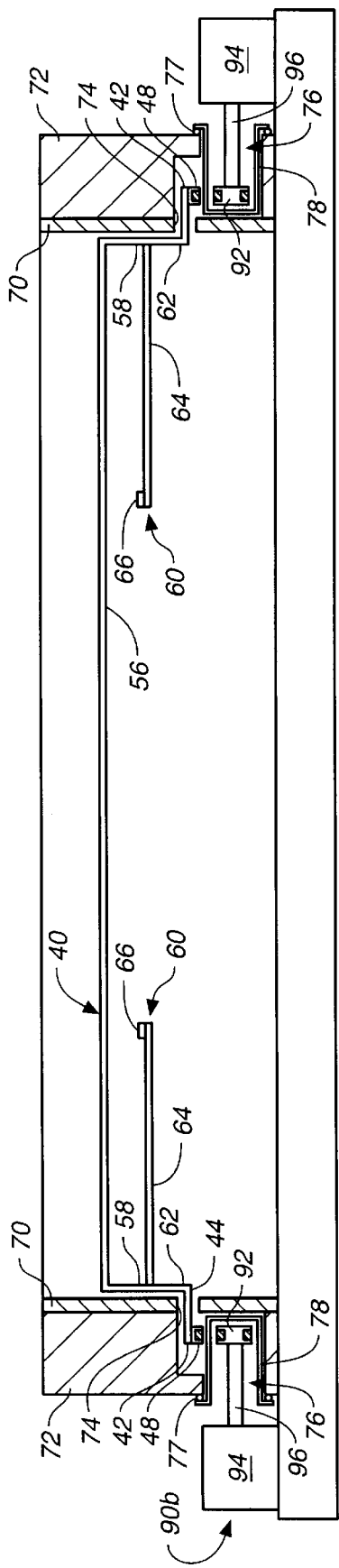
FIG._5
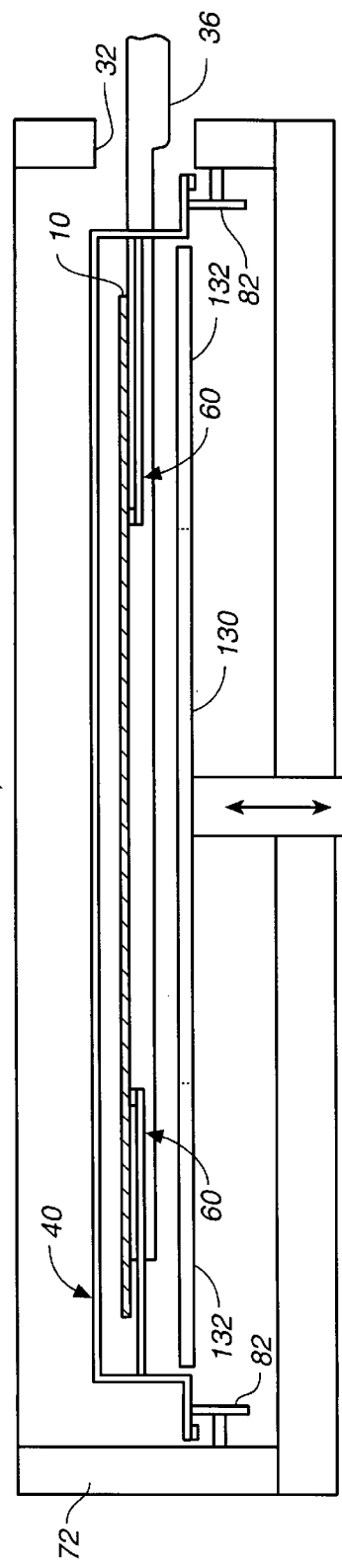
FIG._7

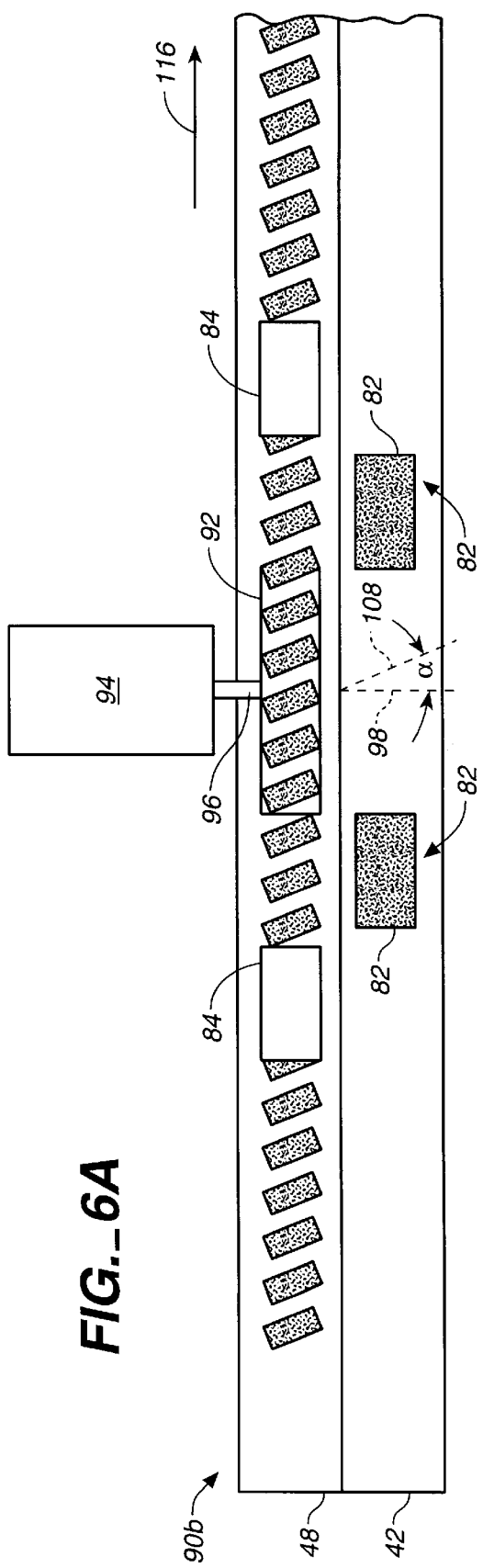
FIG._6A
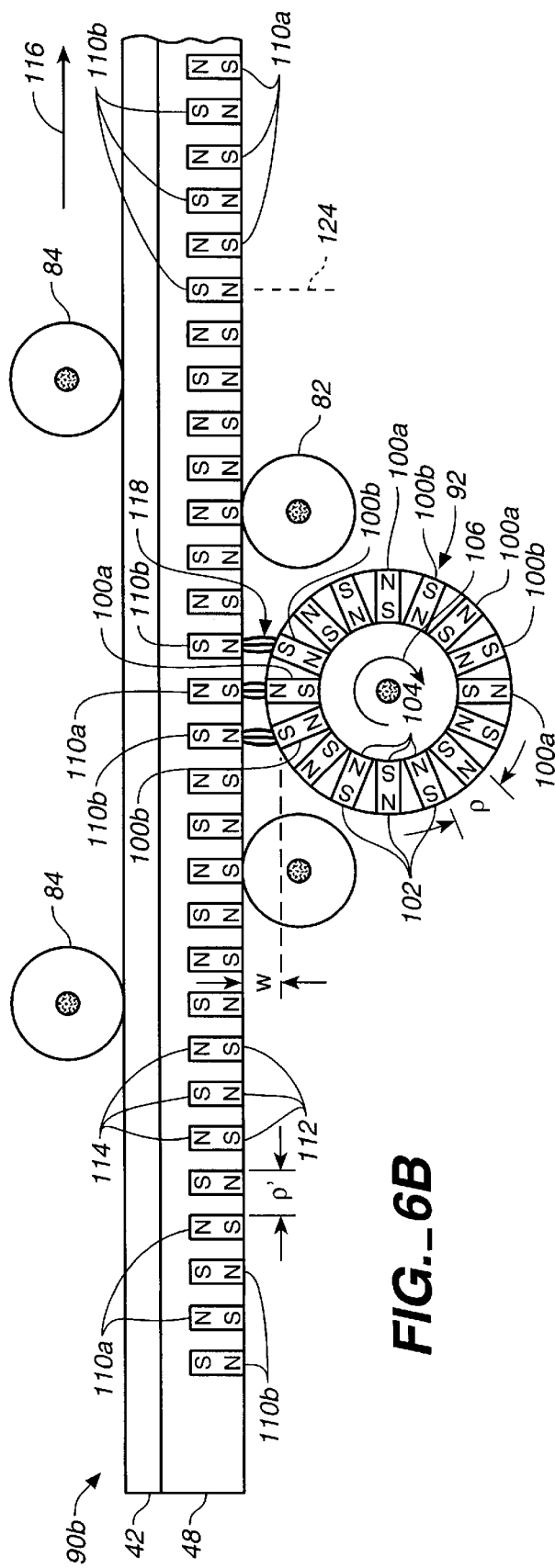
FIG._6B

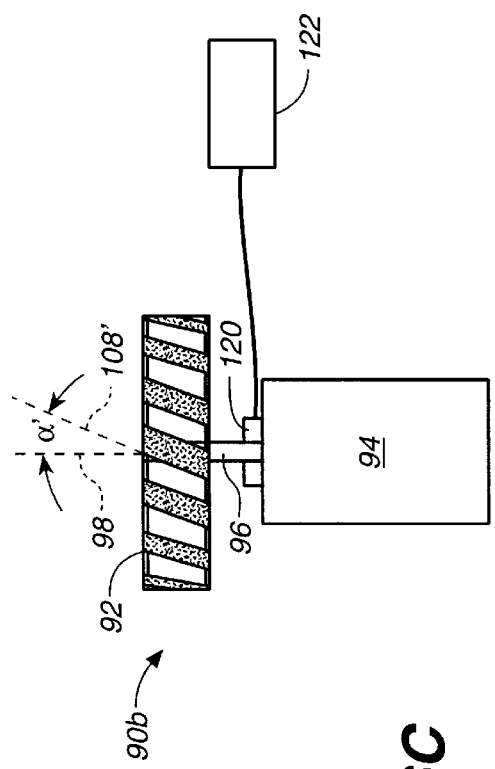
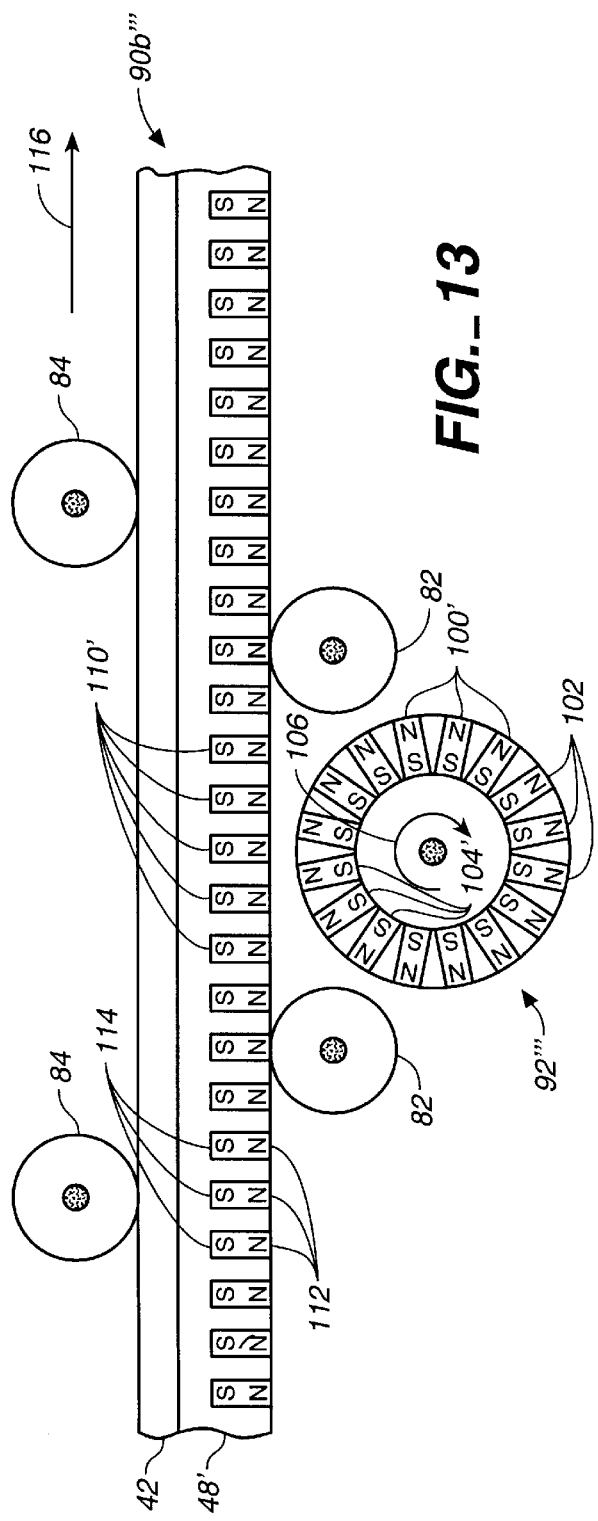

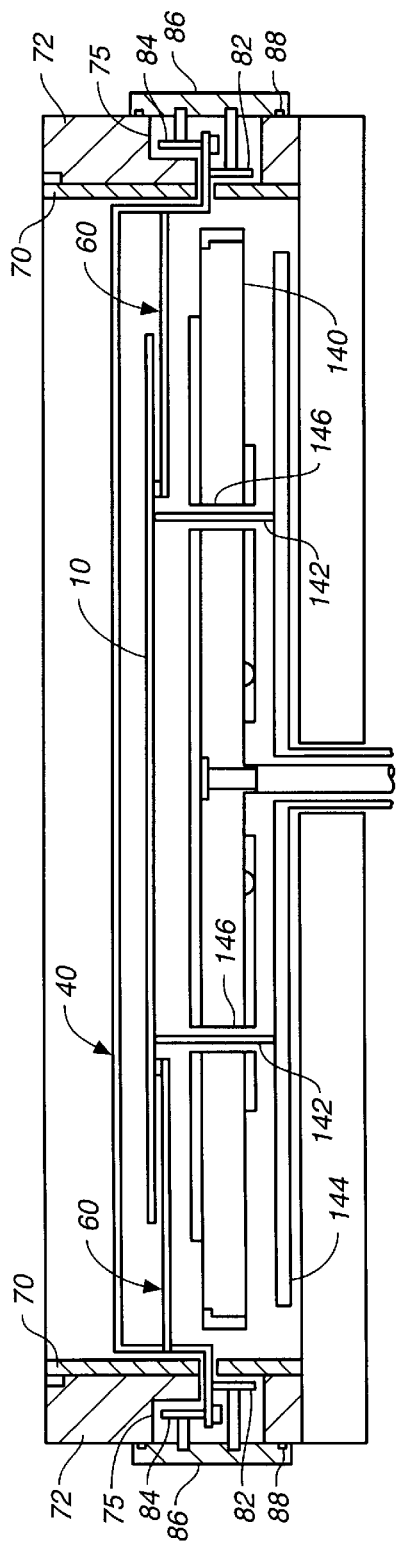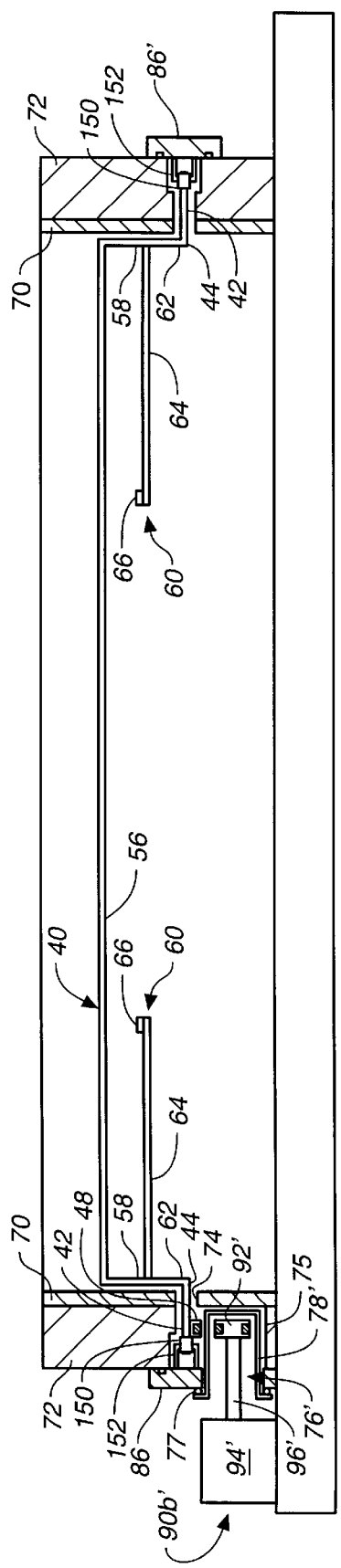

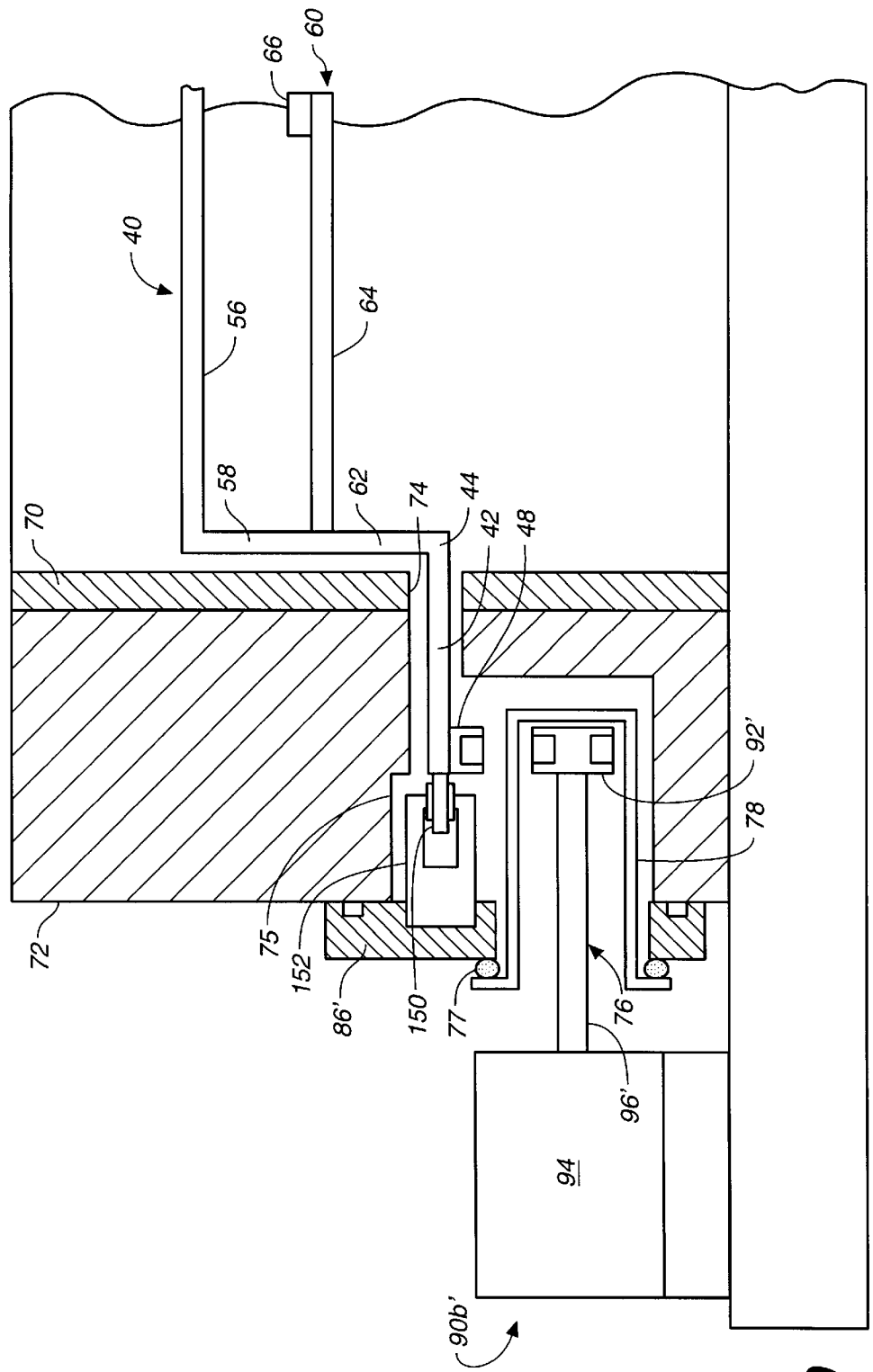
FIG._10

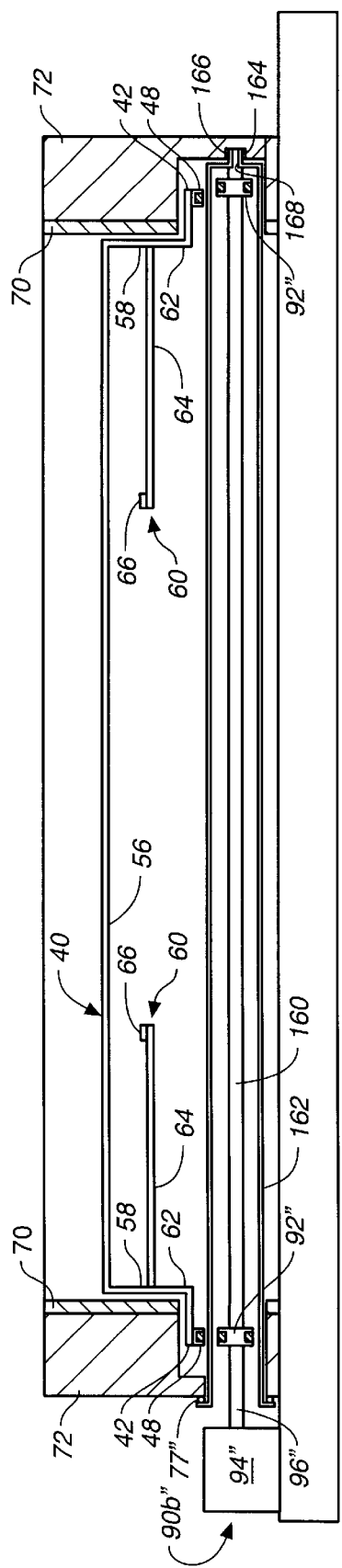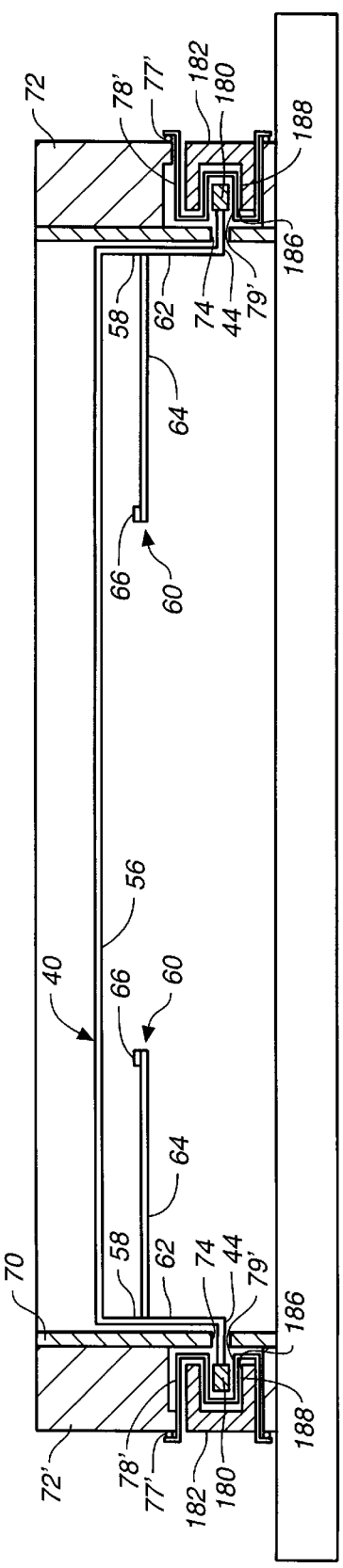

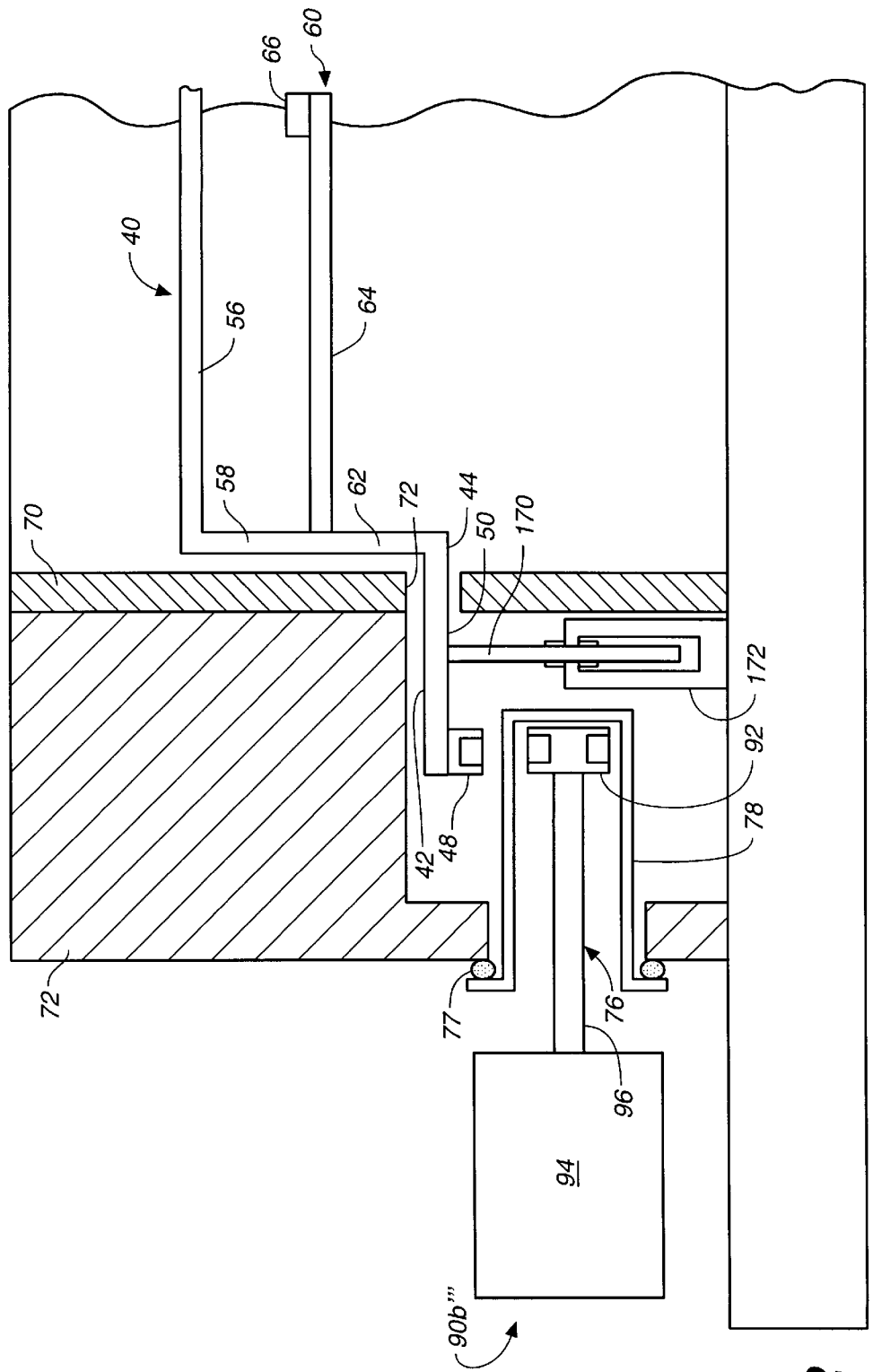
FIG._12

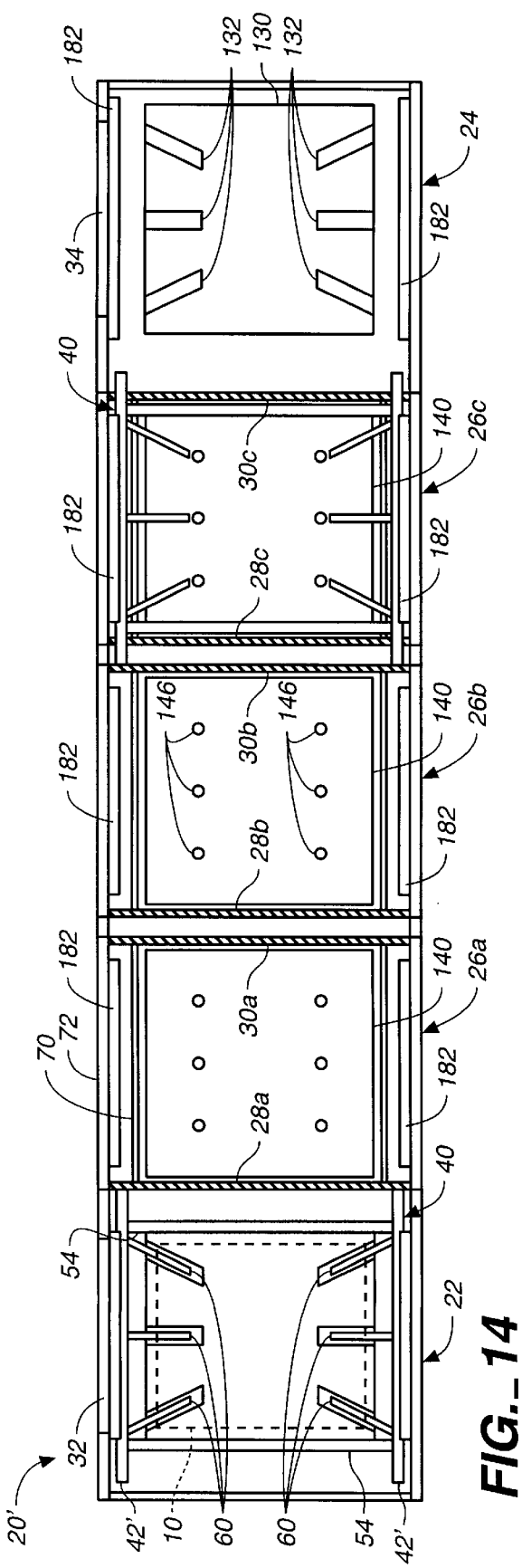
FIG._14
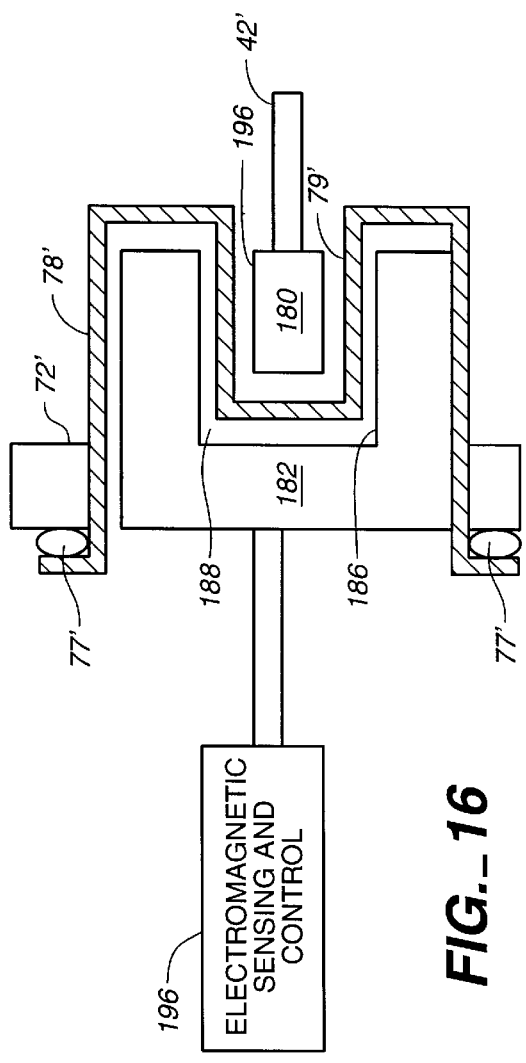
FIG._16

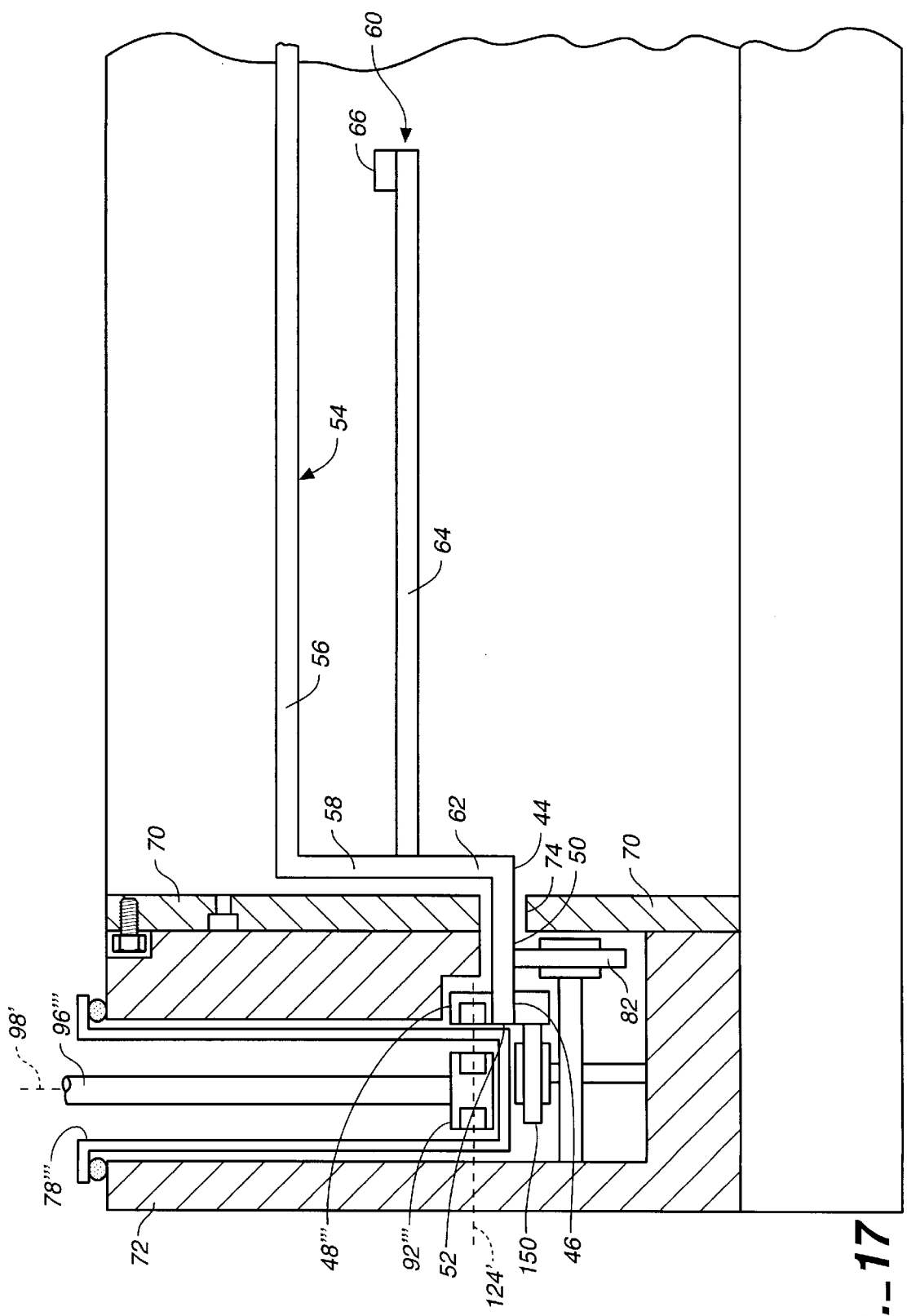
FIG._17

SUBSTRATE TRANSFER SHUTTLE HAVING A MAGNETIC DRIVE

RELATED APPLICATIONS

The present application is related to co-pending U.S. patent application Ser. No. 08/946,922, filed Oct. 8, 1997 and entitled "Modular On-Line Processing System," as well as the following U.S. patent applications which are being filed concurrently with this application: (1) "Method and Apparatus for Substrate Transfer and Processing", U.S. patent application Ser. No. 09/082,428; (2) "Isolation Valves,", U.S. patent application Ser. No. 09/082,376; (3) "An Automated Substrate Processing System,", U.S. patent application Ser. No. 09/082,413; (4) "Substrate Transfer Shuttle,", U.S. patent application Ser. No. 08/082,484; (5) "In-Situ Substrate Transfer Shuttle,", U.S. patent application Ser. No. 09/082,488; and (6) "Multi-Function Chamber For A Substrate Processing System,", U.S. patent application Ser. No. 09/082,375.

The foregoing patent applications, which are assigned to the assignee of the present application, are incorporated herein by reference in their entirety.

BACKGROUND

The present invention relates generally to substrate processing, and more particularly to the transfer of substrates to and from processing chambers.

Glass substrates are being used for applications such as active matrix television and computer displays, among others. Each glass substrate can form multiple display monitors each of which contains more than a million thin film transistors.

The processing of large glass substrates often involves the performance of multiple sequential steps, including, for example, the performance of chemical vapor deposition (CVD) processes, physical vapor deposition (PVD) processes, or etch processes. Systems for processing glass substrates can include one or more process chambers for performing those processes.

The glass substrates can have dimensions, for example, of 550 mm by 650 mm. The trend is toward even larger substrate sizes, such as 650 mm by 830 mm and larger, to allow more displays to be formed on the substrate or to allow larger displays to be produced. The larger sizes place even greater demands on the capabilities of the processing systems.

Some of the basic processing techniques for depositing thin films on the large glass substrates are generally similar to those used, for example, in the processing of semiconductor wafers. Despite some of the similarities, however, a number of difficulties have been encountered in the processing of large glass substrates that cannot be overcome in a practical way and cost effectively by using techniques currently employed for semiconductor wafers and smaller glass substrates.

For example, efficient production line processing requires rapid movement of the glass substrates from one work station to another, and between vacuum environments and atmospheric environments. The large size and shape of the glass substrates makes it difficult to transfer them from one position in the processing system to another. As a result, cluster tools suitable for vacuum processing of semiconductor wafers and smaller glass substrates, such as substrates up to 550 mm by 650 mm, are not well suited for the similar processing of larger glass substrates, such as 650 mm by 830 mm and above. Moreover, cluster tools require a relatively large floor space.

Similarly, chamber configurations designed for the processing of relatively small semiconductor wafers are not particularly suited for the processing of these larger glass substrates. The chambers must include apertures of sufficient size to permit the large substrates to enter or exit the chamber. Moreover, processing substrates in the process chambers typically must be performed in a vacuum or under low pressure. Movement of glass substrates between processing chambers, thus, requires the use of valve mechanisms which are capable of closing the especially wide apertures to provide vacuum-tight seals and which also must minimize contamination.

Furthermore, relatively few defects can cause an entire monitor formed on the substrate to be rejected. Therefore, reducing the occurrence of defects in the glass substrate when it is transferred from one position to another is critical. Similarly, misalignment of the substrate as it is transferred and positioned within the processing system can cause the process uniformity to be compromised to the extent that one edge of the glass substrate is electrically non-functional once the glass has been formed into a display. If the misalignment is severe enough, it even may cause the substrate to strike structures and break inside the vacuum chamber.

Other problems associated with the processing of large glass substrates arise due to their unique thermal properties. For example, the relatively low thermal conductivity of glass makes it more difficult to heat or cool the substrate uniformly. In particular, thermal losses near the edges of any large-area, thin substrate tend to be greater than near the center of the substrate, resulting in a non-uniform temperature gradient across the substrate. The thermal properties of the glass substrate combined with its size, therefore, makes it more difficult to obtain uniform characteristics for the electronic components formed on different portions of the surface of a processed substrate. Moreover, heating or cooling the substrates quickly and uniformly is more difficult as a consequence of its poor thermal conductivity, thereby reducing the ability of the system to achieve a high throughput.

The transportation of substrates between chambers in a processing system is usually automated. To achieve a high throughput, substrates must be transported between chambers as quickly as possible. However, substrates, must be placed with great accuracy in order to be processed correctly. Consequently, sudden acceleration or deceleration of the substrate during transport may jar and misalign it. For example, jittering or vibration caused by a drive mechanism, or a sudden impact when the substrate is transferred from one drive mechanism to another, can misalign or even damage the substrate, thereby reducing process yield.

Another problem in substrate transport is contamination. Specifically, the drive mechanism may generate particles that contaminate the substrate, thereby causing defects that reduce process yield.

SUMMARY

In one aspect, the invention is directed to an apparatus for performing a thin film fabrication process on a substrate. The apparatus has a first chamber, a second chamber in communication with the first chamber, a substrate support moveable along a path between the first chamber and the second chamber, and a magnetic drive including a first magnetic surface to generate a first magnetic field and a second magnetic surface to generate a second magnetic field.

The first magnetic surface is magnetically engageable with the second magnetic surface so that movement of the second magnetic field causes the support to move along the linear path.

Implementations of the invention may include the following. Movement of the second magnetic field may be caused by modifying the current flowing through electromagnets in an electromagnetic drive assembly, or by movement of the second magnetic surface. The first magnetic surface may be located on the support, and the second magnetic surface may be located outside a process environment of the first and second chambers. A rotatable pinion may have the second magnetic surface. The rotatable pinion may be located outside an evacuable chamber. The path between the first and second chambers may be generally linear.

The support may include a plurality of linearly-spaced magnets, and a rotatable pinion may have a plurality of pinion magnets. The pinion magnets and the linearly-spaced magnets can magnetically engage so that rotation of the pinion will cause the support to move along the path. A magnetic levitation assembly may magnetically levitate the substrate support. The guide rollers can contact an upper and a lower surface of the support. The linearly-spaced magnets may be along at least one side of the support. Guide rollers may also be positioned to engage at least one side of the support.

The pinion magnets may include a first set of magnets having a first polarity interleaved with a second set of magnets having a second polarity. The linearly-spaced magnets may include a third set of magnets with the second polarity interleaved with a fourth set of magnets with the first polarity. The pinion and linearly-spaced magnets may be positioned such that the first and third sets of magnets can magnetically couple and the second and fourth sets of magnets can magnetically couple. The first and second pluralities of magnets may have magnetic axes that are oriented substantially radially, and the third and fourth pluralities of magnets may have magnetic axes that are orientated substantially perpendicular to the axis of rotation of the pinion. The pinion may be located between the first and second chambers.

A third chamber may be in communication with the second chamber, and a second rotatable pinion may be located between the second and third chambers. The second pinion may include a second plurality of pinion magnets. The support may be moveable along a second path between the second chamber and the third chamber, and the second plurality of pinion magnets and the linearly-spaced magnets can magnetically engage so that rotation of the second pinion will cause the support to move along the second linear path. A first motor may rotate the first pinion and a second motor may rotate the second pinion. A control system synchronize the operation of the first and second motors.

Each rack magnet and each pinion magnet may be a plate. Each plate may be oriented at an angle α, e.g., between about 0° and 45°, between a primary axis of the plate and an axis of rotation of the pinion.

The shuttle may have first and second pluralities of rack magnets located along opposite sides of the shuttle, and there may be a first rotatable pinion having a first plurality of pinion magnets and a second rotatable pinion having a second plurality of pinion magnets. The first plurality of pinion magnets can magnetically engage the first plurality of rack magnets and the second plurality of pinion magnets can magnetically engage the second plurality of rack magnets, so that rotation of the first and second pinions causes movement of the shuttle along the linear path. A first motor may drive the first pinion. A second motor may drive the second pinion, or a drive shaft may connect the first pinion and the second pinion.

The substrate support may be a substrate transfer shuttle. A plurality of linearly-spaced magnets may be on one side of the shuttle, e.g., in a rack. A rotatable pinion having a plurality of pinion magnets may be positioned adjacent the one side of the shuttle. A second plurality of linearly-spaced magnets, e.g., in a second rack, may be positioned on an opposite side of the shuttle, and a second rotatable pinion having a second plurality of pinion magnets may be positioned adjacent the opposite side of the shuttle.

In another aspect, the invention is directed to a substrate transport apparatus. The substrate transport apparatus includes a transfer shuttle moveable along a generally path and including a plurality of linearly-spaced magnets, and a rotatable pinion having a plurality of pinion magnets. The pinion magnets and the linearly-spaced magnets can magnetically engage so that rotation of the pinion will cause the shuttle to move along the path.

In another aspect, the invention is directed to a method of transporting a substrate between chambers of a fabrication system. In the method, a substrate is supported on a substrate support that has a plurality of linearly-spaced magnets and that is moveable along a path between a first chamber and a second chamber. A pinion having a plurality of pinion magnets is rotated so that the pinion magnets and the linearly-spaced magnets magnetically engage to move the substrate support along the path.

Advantages of the invention may include the following. Substrates, particularly large glass plates, may be transported smoothly and quickly between chambers with smooth acceleration and deceleration, and with little jittering, jarring, or vibration. Particle generation by the drive mechanism is minimized, thereby reducing defects and increasing process yield.

Other features and advantages of the invention will become apparent from the following description, including the drawings and the claims.

BRIEF DESCRIPTION OF THE DRAWINGS

FIG. 1 is a schematic top plan view of a substrate processing system according to the present invention.

FIG. 2 is a schematic side view of the substrate processing system of FIG. 1.

FIG. 3 is a schematic perspective view of a substrate transfer shuttle used in the substrate processing system of FIG. 1.

FIG. 4 is a schematic partial cross-sectional view of a processing chamber and the substrate transport shuttle of the substrate processing system of FIG. 1, illustrating the guide rollers for the shuttle.

FIG. 5 is a schematic cross-sectional view of a drive mechanism and the substrate transport shuttle of the substrate processing system of FIG. 1, illustrating the magnetic rack and pinion drive.

FIG. 6A is a schematic top view of the magnetic rack and pinion drive mechanism at the left-hand side of the substrate processing system of FIG. 1.

FIG. 6B is a schematic side view of the magnetic rack and pinion drive mechanism of FIG. 6A.

FIG. 6C is a bottom view of the magnetic pinion of the magnetic rack and pinion drive mechanism of FIG. 6A.

FIG. 7 is a schematic cross-sectional view of a load lock chamber of the substrate processing system of FIG. 1.

FIG. 8 is a schematic cross-sectional view of a process chamber of the substrate processing system of FIG. 1.

FIG. 9 is a schematic cross-sectional view of an embodiment of a magnetic rack and pinion drive mechanism having one motor and one magnetic pinion.

FIG. 10 is an enlarged schematic cross-sectional view of the embodiment FIG. 9.

FIG. 11 is a schematic cross-sectional view of an embodiment of a magnetic rack and pinion drive mechanism having one motor and two magnetic pinions.

FIG. 12 is a schematic cross-sectional view of an embodiment of a magnetic rack and pinion drive mechanism having a support roller that is aligned coaxially with a magnetic pinion.

FIG. 13 is a schematic side view of an embodiment of a magnetic rack and pinion drive mechanism in which the proximate faces of the rack magnets and the pinion magnets have the same polarity.

FIG. 14 is a schematic cross-sectional view of an embodiment of a magnetic drive system which uses a magnetic levitation drive mechanism.

FIG. 15 is a schematic cross-sectional view of the magnetic drive system of FIG. 14.

FIG. 16 is an enlarged view of FIG. 15.

FIG. 17 is a schematic cross-sectional view of a magnetic rack and pinion drive mechanism in which the magnetic pinion rotates about a vertical axis.

DETAILED DESCRIPTION

Referring to FIGS. 1 and 2, a substrate processing system 20 is shown as including an entry load lock chamber 22, an exit load lock chamber 24, and three processing chambers 26a, 26b, and 26c. The processing chambers are connected in series between the two load lock chambers in a generally linear arrangement. Although three processing chambers are illustrated, the processing system 20 could include one, two, or four or more processing chambers, depending on the fabrication process to be performed. A description of similar processing systems may be found in the aforementioned application entitled "Method and Apparatus for Substrate Transfer and Processing".

Each processing chamber includes first and second gate valves 28a–28c and 30a–30c, respectively, located at opposite ends of the chamber. Each gate valve can be opened to permit. substrates to be transferred through the valve, and closed to seal the adjacent chambers. Gate valve 28a seals the entry load lock chamber 22 from the first processing chamber 26a, gate valves 30a and 28b seal the first processing chamber 26a from the second processing chamber 26b, gate valves 30b and 28c seal the second processing chamber 26b from the third processing chamber 26c, and gate valve 30c seals the third processing chamber 26c from the exit load lock chamber 24. Each gate valve may be constructed as described in the aforementioned application entitled "Isolation Valves".

In addition, the entry and exit load lock chambers 22 and 24 have respective slit or gate valves 32 and 34. Valves 32 and 34 can be opened to permit introduction or removal of a substrate from the processing system 20, and closed to seal the associated load lock chamber from the external atmosphere.

In operation, a substrate 10 (shown in phantom in FIG. 1) is transported by one or more substrate transfer shuttles 40 along a generally linear path which passes through the entry load lock chamber 22, the processing chambers 26a–26c and the exit load lock chamber 24. Although two transfer shuttles are illustrated, there could be just one shuttle, or three shuttles, or even more than three shuttles (if there are more than three processing chambers). Each shuttle can be moved independently of the other shuttles. The maximum number of shuttles is one less than the total number of chambers (including both processing and load lock chambers) in the processing system. If the processing system 20 includes just one shuttle, that shuttle may transfer the substrate through each chamber. If, as illustrated, the processing system 20 includes two shuttles, one shuttle may transfer the substrate from the entry load lock chamber 22 through the first processing chamber 26a to the second processing chamber 26b, and the other shuttle may transfer the substrate from the second processing chamber 26b through the third processing chamber 26c to the exit load lock chamber 24. Other transfer procedures are possible.

Referring to FIGS. 1 and 4, the processing system 20 includes a guide system 80 to support and guide one or both shuttle(s) 40 along a fixed horizontal path extending through the processing system. Specifically, each load lock chamber and each processing chamber includes two lower guide rollers 82 and two upper guide rollers 84 on each side of the chamber to engage the shuttle as it passes through the chamber.

Referring to FIG. 3, each shuttle 40 is generally laterally symmetric and includes two spaced-apart side rails 42 that extend substantially parallel to the longitudinal axis of the processing system when the shuttles are positioned in the processing system. c described in greater detail below, whereas an inboard portion 50 of the underside of each side rail 42 is flat to engage the lower guide rollers 82 (see FIG. 4). A top surface 52 of each rail is flat to engage the upper guide rollers 84 (see FIG. 4). Thus, the lower guide rollers 82 support the shuttle, and the upper guide rollers 84 prevent the shuttle 40 from lifting vertically off the lower guide rollers 82.

The two side rails 42 are connected by one or more lateral crossmembers 54. As shown, one crossmember may be located near each end of the shuttle. Each crossmember 54 includes a flat horizontally-extending strip 56 and two legs 58 that depend from the ends of the strip and are connected to the side rails 42.

A plurality of substrate support fingers 60, e.g., three on each side of the shuttle, extend inwardly from the side rails 42. Each finger 60 has a proximal portion 62 that extends upward from the side rail and a distal portion 64 that extends horizontally inward to a tip. In the outermost fingers, the distal portion 64 may be angled inwardly. A pad 66 (see also FIG. 4) is positioned on the upper surface of the tip of each finger to support the substrate. The pad 66 may be made of a material such as a ceramic, stainless steel, quartz, whereas the rest of shuttle 40 may be made of stainless steel, invar, or another material having a low coefficient of thermal expansion and a lower thermal mass.

Referring to FIG. 4, each processing chamber, e.g., chamber 26a, is defined by an inner chamber wall 70 and an outer chamber wall 72. The inner chamber wall 70 may extend parallel to the outer chamber wall 70 to support processing chamber components. A generally horizontal slot 74 may be formed in the inner chamber wall 70, and a recess 75 may be formed in the outer chamber wall 72 adjacent the slot 74. A sealing plate 86 may be secured against the outer surface of the outer chamber wall 72 across the recess 75, and a seal 88, such as an O-ring, may be used to seal the processing environment from the ambient atmosphere. The lower and upper rollers 82 and 84 may be rotatably connected to the sealing plate 86 so that they are suspended inside the recess 75. A portion 44 of each side rail 42 may extend through the slot 74 and into the recess 75 to contact the rollers. The slot is sufficiently narrow that the elements that interact with the side rail, e.g., the lower and upper rollers 82 and 84, are generally protected from the fabrication process that occurs inside the chamber. Similarly, the slot 74 acts to prevent particles generated by the rollers 82 and 84 from entering the central area of the chamber and accumulating on the substrate. The rollers 82 and 84 may be made of a material that tends not to produce particles, such as a polimide plastic, such as Vespel®, available from E. I. du Pont de Nemours and Company, of Wilmington, Del. Other possible materials for the rollers include ceramics, quartz, and aluminum or stainless steel with a Teflam™ coating, available from CS Hyde Company, Inc., of Lake Villa, Ill.

As shown in FIGS. 1 and 2, the processing system 20 includes a drive system having a plurality of magnetic drive mechanisms 90a–90d for moving the shuttles along the horizontal path defined by the guide system 80. One magnetic drive mechanism 90a is located at the downstream end of the entry load lock chamber 22, and one magnetic drive mechanism 90d is located at the upstream end of the exit load lock chamber 24 (upstream and downstream are relative to the travel of a substrate from the entry load lock to the exit load lock). Magnetic drive mechanism 90b is located between adjacent process chambers 26a and 26b, whereas magnetic drive mechanism 90c is located between adjacent process chambers 26b and 26c. The two so-called intermediate drive mechanisms 90b and 90c may be located between adjacent valves 30a, 28b and 30b, 28c, respectively. The two so-called end drive mechanisms 90a this and 90d may be located adjacent to valves 28a and 30c, respectively. This provides a high degree of modularity as each processing chamber has a similar structure and is interchangeable. Each magnetic drive mechanism can be operated independently to move the shuttles through the processing system. The rails 42 of the shuttle are sufficiently long to span two drive mechanisms.

Referring to FIGS. 5 and 6A–6C (certain elements of the substrate processing system are not illustrated in FIGS. 6A–6C for the sake of clarity), each magnetic drive mechanism, e.g., drive mechanism 90b, includes two wheel-shaped magnetic pinions 92 positioned on opposite sides of the processing system outside outer chamber wall 72. Each magnetic pinion 92 may be positioned equidistant from the two closest lower rollers 82. For the intermediate drive mechanisms, the magnetic pinions 92 are located between adjacent valves, whereas the rollers 82 and 84 are located on opposite sides of the valve gap (see FIG. 1) in the processing chambers. The magnetic pinions 92 of drive mechanisms 90a and 90d are located on the upstream and downstream sides, respectively, of the valves to the load lock chambers 22 and 24. For these end drive mechanisms, one pair of rollers is located in the associated load lock chamber, and one pair of rollers is located in the adjacent processing chamber (see FIG. 1).

As best shown in FIG. 5, on each side of the processing system, a cup 78 may be secured, e.g., with bolts (not shown), in an aperture in the outer chamber wall 72. An O-ring 77 may be located between the cup 78 and the outer chamber wall 72 to seal the processing environment from the external or ambient environment. The cup defines a recess 76, and each magnetic pinion 92 may be positioned in an associated recess 76 so that it is located outside the processing environment but positioned directly beneath one of the magnetic racks 48. The magnetic pinion 92 is thus separated from the magnetic rack 48 by a gap having a width, W, (see FIG. 6B). The portion of the cup 78 between the magnetic rack 48 and the magnetic pinion 92 is formed of a material having a low magnetic permeability, such as aluminum.

Each magnetic pinion 92 may be coupled to a motor 94 by a drive shaft 96. The axis of rotation (shown by dashed line 98) of the drive shaft 96 and the magnetic pinion 92 is generally perpendicular to the longitudinal dimension of the rails 42.

Each pinion 92 includes a plurality of interleaved pinion magnets 100a and 100b of alternating polarity. Each pinion magnet is aligned so that its magnetic axis passes substantially through the axis of rotation 98 of the pinion. Similarly, each rack 48 includes a plurality of interleaved rack magnets 110a and 110b of alternating polarity. The magnetic axis of each rack magnet is aligned substantially perpendicular to the axis of rotation of the pinion, e.g., along a vertical axis 124 if the axis of rotation is substantially horizontal. The rack magnets 110a and 110b may be recessed so that they are flush with the bottom surface of the rack 48, and the pinion magnets may be recessed so that they are flush with the outer rim of the pinion 92.

Each magnet in the rack 48 and the pinion 92 may be a substantially rectangular plate which is magnetized so that there is a north pole "N" at one face of the plate and a south pole "S" at the opposite face of the plate. For example, pinion magnets 100a are oriented with their north poles at exterior faces 102 of the plates and their south poles at interior faces 104 of the plates. On the other hand, pinion magnets 100b are oriented with their north poles at interior faces 104 of the plate and their south poles at exterior faces 102 of the plates. Similarly, each rack magnet 110a is oriented with a north pole at an upper face 114 of the plate and a south pole at a lower face 112 of the plate. Conversely, each rack magnet 110b is oriented with a north pole at the lower face 112 of the plate and a south pole at the upper face 114 of the plate.

As shown in FIG. 6A, a primary axis of each rack magnet plate (shown by dashed line 108) may be arranged with a so-called "helix" angle a between the axis of rotation 98 and the primary axis 108. As shown in FIG. 6C, the pinion magnet plates may be arranged with the same helix angle $\alpha'$ between the axis of rotation 98 of the pinion 92 and the primary axis 108' of the pinion magnets. The helix angle may be up to about 45°. Alternately, the primary axis of each magnet may be oriented generally parallel to the axis of rotation 98 of the pinion ($\alpha=0°$). Thus, the helix angle may be between about 0 and 45°. By positioning the magnets at a helix angle, the variations in the magnetic attraction forces between the rack and pinion magnets as their magnetic fields engage and disengage are reduced, thereby providing a smoother linear motion of the shuttle. In either case, at the closest point of approach, the pinion magnet will be substantially coplanar with its associated rack magnet.

The pinion magnets 100a and 100b are separated by a pitch P, which is equal to the pitch P' of the rack magnets 110a and 110b. The pitches P and P' may be about ¼ inch. The specific pitch may be selected based on the strength of the magnets, the weight of the shuttle, the width W of the gap between the rack and pinion, and the desired speed at which the shuttle will move between chambers.

As best shown in FIG. 6B, the rack and pinion magnets engage as their opposing poles lock together (shown by lines of magnetic force 118). If the pinion 92 is rotating, then as each pinion magnet, e.g., pinion magnet 10a, moves toward the rack 48, it will magnetically couple with the closest magnet of opposing polarity, e.g., rack magnet 110a. In addition, the adjacent pinion magnets 100b (of opposite polarity as pinion magnet 10a) will be magnetically coupled to the adjacent rack magnets 110b. Thus, as the pinion 92 rotates, e.g., in the direction shown by arrow 106, the shuttle 40 will be driven horizontally, i.e., in the direction shown by arrow 116. Conversely, if the pinion 92 rotates in a direction opposite to arrow 106, the shuttle 40 will be driven in a direction opposite to arrow 116.

The alternating polarity of the magnets prevents magnetic coupling slippage between adjacent magnets in the rack and pinion. Since the engagement between the rack and pinion is magnetic, there is a slight give in the coupling, so that the motion of the rack is substantially without jittering or mechanical shock. Furthermore, the placement of a magnetic rack on each side of the shuttle tends to keep the shuttle centered. Specifically, there is an attractive magnetic force between the right-hand pinion and right-hand rack, and a similar attractive magnetic force between the left-hand pinion and the left-hand rack. These two attractive magnetic forces prevent lateral motion, i.e., motion perpendicular to the longitudinal axis of the processing system, by the shuttle. This permits the processing system to be constructed without lateral guide rollers. Also, since there are no rotary feedthroughs or direct physical contact between the rack and pinion, the danger of contamination from the drive mechanism is reduced. Specifically, since the motor and pinion are located outside the processing environment (i.e., the sealed environment between valves 32 and 34 in which substrate handling, film deposition and film processing occurs) of the chambers, the processing chambers and load lock chambers should not be contaminated.

Each drive mechanism may include an encoder 120 which provides input to a control system 122, e.g., a general purpose programmable digital computer, to indicate the rotation of the associated drive shaft. The control system 122 may also be connected to each of the chambers and to any robotic handling equipment for controlling the operations of the processing system. The drive mechanisms 90a–90d may be synchronized by the control system 122 to smoothly transfer or "hand off" the shuttles from one drive mechanism to the next.

To move the shuttle 40 from the entry load lock chamber 22 to the first processing chamber 26a, only drive mechanism 90a is used. However, to move the shuttle to the second processing chamber 26b, the shuttle must be switched or handed off from drive mechanism 90a to drive mechanism 90b. To accomplish this hand-off, the shuttle is driven forward by drive mechanism 90a from a position in processing chamber 26a until the magnetic racks 48 of the shuttle engage the magnetic pinions of drive mechanism 90b. At this point, the forward motion of the magnetic rack caused by drive mechanism 90a induces rotation in the magnetic pinions of drive mechanism 90b. When this rotation is sensed by the encoder 120 of the drive mechanism 90b, the control system 122 powers the motor of drive mechanism 90b and shuts down the motor of drive mechanism 90a. As the drive mechanism 90b moves the shuttle into the second processing chamber, the magnetic rack disengages from the drive mechanism 90a. Thus, the processing system can transfer the shuttle from one drive system to the next without any sudden impacts or jarring motions. A similar process is used to transfer the shuttle from the second processing chamber 26b to the third processing chamber 26c, and from the third processing chamber 26c to the exit load lock chamber 24.

Referring to FIG. 7, entry load lock chamber 22 includes a vertically actuatable platen 130 for supporting a substrate during heating prior to processing. Exit load lock chamber 24 also includes a vertically-actuatable platen 130 to support a substrate during cooling after processing. Each platen has a plurality of channels 132 (see FIG. 1) configured to accommodate vertical motion of the fingers 60 of a shuttle when the platen is raised or lowered.

As noted, a substrate 10 is loaded horizontally into the entry load lock chamber 22 by a first robot end effector 36 through valve 32. Then the robot end effector descends, with the tines of the end effector passing between the shuttle fingers 60, until the substrate rests on the pads 66. The end effector is then withdrawn from the load lock chamber 22, the valve 32 is closed, and the chamber is evacuated. The platen 130 is raised such that it passes around the shuttle fingers 60, each finger being accommodated by one of the channels 132. The loading of the substrate into the entry load lock chamber is discussed in greater detail in the aforementioned application entitled "Method and Apparatus for Substrate Transfer and Processing". The substrate may then be preheated to a desired temperature prior to processing by heating elements (not shown) in the platen or the chamber walls.

Once the substrate is heated, the platen may be lowered so that the substrate rests on the shuttle. Then valve 28a may be opened, and drive mechanism 90a activated to move the shuttle downstream into the first processing chamber 26a.

Referring to FIG. 8, each processing chamber, e.g., the first processing chamber 26a, may include a vertically actuatable susceptor 140 for supporting a substrate during processing. A plurality of lift pins 142, which can be raised and lowered relative to the susceptor 140 by a lift pin plate 144, extend through vertical passages 146 in the susceptor.

When the shuttle enters the processing chamber, the substrate and shuttle fingers pass over the susceptor 140. After the shuttle stops, the lift pins are raised so that they lift the substrate off the shuttle. Then the shuttle may be withdrawn from the processing chamber. Once the shuttle is out of the chamber, the chamber may be sealed by closing valve 28a (and valve 30a if it has been opened). The lift pins 142 may then be lowered relative to the susceptor to place the substrate atop the susceptor for processing. Once processing is completed, the lift pins are raised to lift the substrate off the susceptor, the shuttle 40 is returned to the processing chamber 26a, and the susceptor and pins are lowered to place the substrates on the shuttle.

At this point, the substrate may be delivered to the second processing chambers 26b. The steps of this transfer may be similar to the steps involved in transferring the substrate from the entry load lock chamber 22 to the first processing chamber 26b. The substrate may be transferred to the third processing chamber 26c by the second shuttle 40 by a similar set of steps. Finally, the substrate is transported to the exit load lock chamber 24 by substantially reversing the steps used to transfer the substrate from the entry load lock chamber 22 to the first processing chamber 26a, although the second shuttle is used rather than the first shuttle. There the substrate is cooled to a handling temperature, the exit load lock chamber is pressurized, and the substrate is removed by a second robot end effector 38 by substantially reversing the steps used to introduce the substrate to the entry load lock chamber 22.

Referring to FIGS. 9 and 10, in another embodiment, each magnetic drive mechanism, e.g., drive mechanism 90b', includes one magnetic pinion 92' and one motor 94' located on one side of the substrate processing system, and one magnetic rack 48' located on the same side of the shuttle as the magnetic pinion 92'. In this embodiment, each load lock chamber and each processing chamber includes at least two lateral guide rollers 150, one on each side of the chamber. Each lateral guide roller 150 may be secured to the outer chamber wall 72 by a bracket 152. The lateral guide rollers 150 engage the sides of the rails 42 to prevent lateral motion of the shuttle as it moves along a horizontal path between the chambers.

Referring to FIG. 11, in another embodiment, each magnetic rive mechanism, e.g., drive mechanism 90b", includes two magnetic pinions 92" located on opposite sides of the processing system, two magnetic racks 48" on opposite sides of the shuttle, and one motor 94" located on one side of the substrate processing system. An axle 160 extends through a tube 162 to connect the magnetic pinions 92". On one side of the processing system, the tube 162 may be sealed to an aperture in the outer chamber wall 72 by an O-ring 77". On the other side of the processing system, the tube may include a projection 164 that extends into a receiving recess 166 in the right-hand outer chamber wall. One side of the axle 160 is supported by the motor 94',, and the opposite side of the axle 160 is supported by a rotary bearing 168 in the projection 164. Thus, when motor 94" rotates drive shaft 96", both pinions 92" rotate. The tube 162 protects the pinions 92" and the axle 160 from the processing environment inside the chamber. For drive mechanisms 90a" and 90d", the tube 162 extends from one lateral side to another of the entry and exit load lock chambers, respectively. For drive mechanisms 90b" and 90c", the tube 162 extends through the gate valve housing between the neighboring processing chambers. This embodiment does not require lateral guide rollers.

Other configurations are possible for the magnetic rack and pinion. For example, referring to FIG. 17, the magnetic pinion 92''' could rotate about a vertical axis 98', with each pinion magnet aligned so that its magnetic axis passes substantially through the axis of rotation of the pinion. In this configuration, the magnetic axis of each magnet in rack 48''' would be arranged along a substantially horizontal axis 124' so as to magnetically engage the pinion magnets. Such a configuration could include lower rollers 82 to support the shuttle and lateral guide rollers 150 to engage the sides of the shuttle.

Other locations are possible for the guide rollers of guide system 80. For instance, referring to FIG. 12, a lower guide roller 170 is positioned co-axially with each magnetic pinion 92 to engage the inboard portion 50 of the underside of the side rail 42. The guide roller 170 is supported by a bracket 172 that may be secured to a base of the chamber.

Other configurations are possible for the magnets of the magnetic rack and pinion. For instance, the rack and pinion need not include interleaved magnets of alternating polarity. Referring to FIG. 13, the magnets 100' of pinion 92''' and the magnets 110' of rack 48' could be arranged such that the proximate faces of the rack and pinion magnets have the same pole (e.g., the north pole). Thus, the rack and pinion magnets repulse each other. This repulsive force causes the pinion magnets 100' to align with the gaps between the rack magnets 110', and vice versa. Consequently, as the pinion 92''' rotates, e.g., in the direction shown by arrow 106, the pinion magnets 100' will urge the rack magnets 110' away and drive the shuttle horizontally, e.g., in the direction shown by arrow 116. This configuration will use lateral guide rollers similar to those shown in FIGS. 9 and 10, and upper rollers to prevent the repulsive force between the magnets from the lifting the shuttle off the lower rollers. In short, the magnetic engagement between the rack and pinion magnets may be accomplished by magnetic coupling between magnets having the opposite poles, or by magnetic repulsion between magnets having the same pole.

Other locations are possible for the magnetic drive mechanisms of the drive system. For example, rather than being located between the chambers, one magnetic drive mechanism may be located at the midline of each chamber. As another example, there could be two magnetic drive mechanisms in each chamber. In this case, the rails of the shuttle could be shorter than the length of the chambers. Furthermore, additional drive mechanisms may be added to increase the torque capacity of the drive system. However, by placing one magnetic drive mechanism at the downstream end of the exit load lock chamber, one magnetic drive mechanism at the upstream end of the exit load lock chamber, and one magnetic drive mechanism between each processing chamber, the number of drive mechanisms is minimized.

The guide system illustrated and described is exemplary. For example, the lower guide rollers could engage an outboard portion of the rail, and the upper guide rollers 84 could engage the inboard portion of the rail. Also, the guide rollers may engage other portions of the shuttle. However, it is preferred that the guide rollers not directly touch the rack magnets. Similarly, the shuttle illustrated and described is exemplary. The number, location and structural relationship of the components of the shuttle, such as the support fingers, rails and crossmembers may be modified without departing from the invention. The invention is generally applicable to any sort of substrate support that transfers the substrate along a path between two chambers of a processing system. In addition, the configuration of the chamber walls of the processing and load lock chambers is exemplary. The invention is generally applicable to any sort of chamber wall configuration that would seal the processing environment from the ambient atmosphere.

Referring to FIGS. 14, 15 and 16, the guide rollers could be replaced by a magnetic levitation system. The magnetic levitation system includes two magnetic shuttle elements 180 secured to the rails 42 on opposite sides of the shuttle 40, and two linear magnetic levitation assemblies 182 located on opposite sides of each chamber. Each magnetic levitation assembly 182 may have a generally C-shaped cross-section with an inner surface 186 that defines a recess 188. As best shown in FIG. 15, on each side of the processing system, an elongated rectangular basin 78' may be secured, e.g., with bolts (not shown), in an aperture in the outer chamber wall 72'. The basin 78' is formed of a material having a low magnetically permeability, such as aluminum. A groove 79' may be formed in and extend along the entire interior side of the basin 78'. An O-ring 77' may be located between the basin 78' and the outer chamber wall 72' to seal the processing environment from the external or ambient environment. Referring to one side of the processing system, e.g., the left side, the magnetic shuttle element 180 extends into the linear groove 79' of the basin 78', and the C-shaped magnetic levitation assembly 182 is positioned in the basin 78' with its interior surface 186 surrounding the groove 79'. Thus, the magnetic levitation assembly 182 is located outside the processing environment but surrounds three sides of the associated magnetic shuttle element 180. Alternately, the aperture and basin may be eliminated, and the magnetic levitation assembly 182 may be secured to the outer chamber wall 72 inside the processing environment.

Each magnetic shuttle element 180 may be constructed of permanent magnets, whereas each magnetic levitation assembly 182 may be constructed of a combination of permanent magnets and electromagnets. The magnets are oriented so that the inner surface 186 of the magnetic levitation assembly 182 has the same pole (e.g., the north pole) as the adjacent surface 196 of the magnetically active element 180. Thus, the repulsive force between the magnets levitates the shuttle. The permanent magnets provide the primary electromagnetic force to support the shuttle. The electromagnets are used to trim or tune the magnetic fields generated by the permanent magnets so that the shuttle 40 is held vertically and laterally stable without contacting the magnetic levitation assemblies or other elements in the chamber. The repulsive magnetic forces generated at opposite sides of the shuttle prevent lateral motion by the shuttle.

The magnetic levitation assemblies 182 may also be used to drive the shuttle horizontally between the chambers. This permits the magnetic pinions to be eliminated. For example, the magnetic shuttle element 180 may include a plurality of evenly spaced-apart magnetic plates, and the electromagnets may provide regions of increased magnetic fields that align with the gaps between the magnetic plates. The electromagnets may be connected to a processor 198 which controls the electromagnetic fields by modifying the current flowing through the electromagnets. The processor may be configured to move the regions of increased magnetic fields along the longitudinal axis of the processing system so as to move the magnetic shuttle elements 180 horizontally and drive the shuttle 40 between the chambers. Alternately, the magnetic pinions may be used instead of or in addition to the magnetic levitation assemblies to drive the shuttle.

The invention is not limited to the embodiments depicted and described. Rather, the scope of the invention is defined by the appended claims.

What is claimed is:

1. An apparatus for processing a substrate comprising:
a first chamber;
a second chamber in communication with the first chamber;
a substrate support movable along a generally linear path between the first chamber and the second chamber, the substrate support including a plurality of linearly-spaced magnets;
a first plurality of guide rollers positioned to contact a lower portion of the substrate support;
a second plurality of guide rollers positioned to contact an upper portion of the substrate support; and
a rotatable pinion having a plurality of pinion magnets, wherein the pinion magnets and the linearly-spaced magnets can magnetically engage so that rotation of the pinion magnets is magnetically translated to the substrate support to move the substrate support along the linear path.

2. The apparatus of claim 1, wherein the substrate support includes a rail and the linearly-spaced magnets are located at an outboard portion of the rail, the first plurality of guide rollers contacting an inboard portion of a lower surface of the rail, and the second plurality of guide rollers contacting an upper portion of the rail.

3. The apparatus of claim 2, wherein the linearly-spaced magnets are on a rack, and the rack is attached to the rail.

4. The apparatus of claim 3, wherein the pinion is positioned beneath the rack.

5. An apparatus for processing a substrate, comprising:
a first chamber;
a second chamber in communication with the first chamber;
a substrate support movable along a generally linear path between the first chamber and the second chamber, the substrate support including a plurality of linearly-spaced magnets;
a rotatable pinion having a plurality of pinion magnets, wherein the pinion magnets and the linearly-spaced magnets can magnetically engage so that rotation of the pinion magnets is magnetically translated to the substrate support to move the substrate support along the linear path wherein each linearly-spaced magnet and each pinion magnet is a plate and each plate is oriented at an angle $\alpha$ between a primary axis of the plate and an axis of rotation of the pinion.

6. The apparatus of claim 5, wherein the angle $\alpha$ is between about 0° and 45°.

7. An apparatus for processing a substrate, comprising:
first chamber;
a second chamber in communication with the first chamber; a substrate transfer shuttle movable along a generally linear path between the first chamber and the second chamber, the shuttle including first and second pluralities of rack magnets located along opposite sides of the shuttle;
a first rotatable pinion having a first plurality of pinion magnets;
a second rotatable pinion having a second plurality of pinion magnets;
a first plurality of guide rollers positioned to contact a lower portion of the shuttle so as to support the shuttle and guide the shuttle along the linear path, and a second plurality of guide rollers positioned to contact an upper portion of the shuttle to prevent the shuttle from lifting off the first plurality of guide rollers; and
wherein the first plurality of pinion magnets can magnetically engage the first plurality of rack magnets and the second plurality of pinion magnets can magnetically engage the second plurality of rack magnets, so that rotation of the first and second pinion magnets is magnetically translated to the shuttle to move the shuttle along the linear path.

8. The apparatus of claim 7, wherein the first and second pluralities of pinion magnets each includes a first set of magnets having a first polarity interleaved with a second set of magnets having a second polarity, and the first and second pluralities of rack magnets each includes a third set of magnets of the second polarity interleaved with a fourth set of magnets of the first polarity, and the first and second pluralities of pinion and rack magnets being positioned such that the first and third sets of magnets can magnetically couple and the second and fourth sets of magnets can magnetically couple.

9. The apparatus of claim 8, wherein the first and second sets of magnets have magnetic axes that are oriented substantially radially, and the third and fourth sets of magnets have magnetic axes that are orientated substantially vertically.

10. The apparatus of claim 7, further comprising a first motor to drive the first pinion.

11. The apparatus of claim 10, further comprising a second motor to drive the second pinion.

12. The apparatus of claim 10, further comprising a drive shaft connecting the first pinion and the second pinion.

13. An apparatus for processing a substrate, comprising:
a first chamber;
a second chamber in communication with the first chamber;

a substrate transfer shuttle movable along a generally linear path between the first chamber and the second chamber, the shuttle including first and second pluralities of rack magnets located along opposite sides of the shuttle;

a first plurality of guide rollers positioned to contact a lower portion of the shuttle;

a second plurality of guide rollers positioned to contact an upper portion of the shuttle;

a first rotatable pinion having a first plurality of pinion magnets;

a second rotatable pinion having a second plurality of pinion magnets; and wherein the first plurality of pinion magnets can magnetically engage the first plurality of rack magnets and the second plurality of pinion magnets can engage the second plurality of rack magnets, so that rotation of the first and second pinions magnets is magnetically translated to the shuttle to move the shuttle along the linear path.

* * * * *

UNITED STATES PATENT AND TRADEMARK OFFICE
CERTIFICATE OF CORRECTION

PATENT NO.    : 6,206,176 B1
DATED         : March 27, 2001
INVENTOR(S)   : Blonigan et al.

It is certified that error appears in the above-identified patent and that said Letters Patent is hereby corrected as shown below:

Column 1,
Line 15, please replace " 08/082,484" with -- 09/082,484 --

Column 7,
Line 33, please delete " this".

Column 8,
Line 42, please replace " a" with -- α --.

Column 11,
Line 12, please replace " rive" with -- drive --.
Line 23, please replace " 94' , ," with -- 94" , --.

Column 13,
Line 35, please replace " substrate" with -- substrate, --.

Column 14,
Line 17, please replace " first" with -- a first --.

Signed and Sealed this

Twentieth Day of November, 2001

Attest:

*Nicholas P. Godici*

NICHOLAS P. GODICI
*Attesting Officer*   *Acting Director of the United States Patent and Trademark Office*